United States Patent [19]

Veleber

[11] 4,001,675
[45] Jan. 4, 1977

[54] TEST SET FOR MEASURING IMPEDANCE AND POWER DISSIPATION OF A CRYSTAL

[75] Inventor: John R. Veleber, Towaco, N.J.

[73] Assignee: R F L Industries, Inc., Boonton, N.J.

[22] Filed: Sept. 22, 1975

[21] Appl. No.: 615,380

[52] U.S. Cl. .............................. 324/56; 324/57 R
[51] Int. Cl.² .................. G01R 29/22; G01R 27/00
[58] Field of Search ................. 324/56, 57 R, 57 Q

[56] References Cited

UNITED STATES PATENTS

| 2,919,398 | 12/1959 | Guttwein et al. | 324/56 |
| 2,931,976 | 4/1960 | Gougoulis | 324/56 |
| 3,832,631 | 8/1974 | Koga et al. | 324/56 |
| 3,840,804 | 10/1974 | Sauerland | 324/56 |

FOREIGN PATENTS OR APPLICATIONS

| 685,811 | 5/1964 | Canada | 324/56 |
| 1,153,384 | 3/1958 | France | 324/56 |
| 634,576 | 3/1950 | United Kingdom | 324/56 |
| 634,577 | 3/1950 | United Kingdom | 324/56 |

Primary Examiner—Gerard R. Strecker
Attorney, Agent, or Firm—Rudolph J. Jurick

[57] ABSTRACT

A crystal test set comprising an oscillator circuit in which a crystal under test is an integral part. The resistor substitution technique is employed in which the crystal and a variable resistor are alternately connected into the oscillator circuit. With the resistor in the circuit, the circuit is tuned to the resonance frequency of the crystal. The value of the resistor is adjusted to produce a voltage across the resistor equal to the voltage across the crystal. The adjusted value of the resistor is measured and corresponds to the crystal impedance. A measuring circuit, responsive to the voltage drop across the crystal, provides a direct measure of the crystal power dissipation.

2 Claims, 6 Drawing Figures

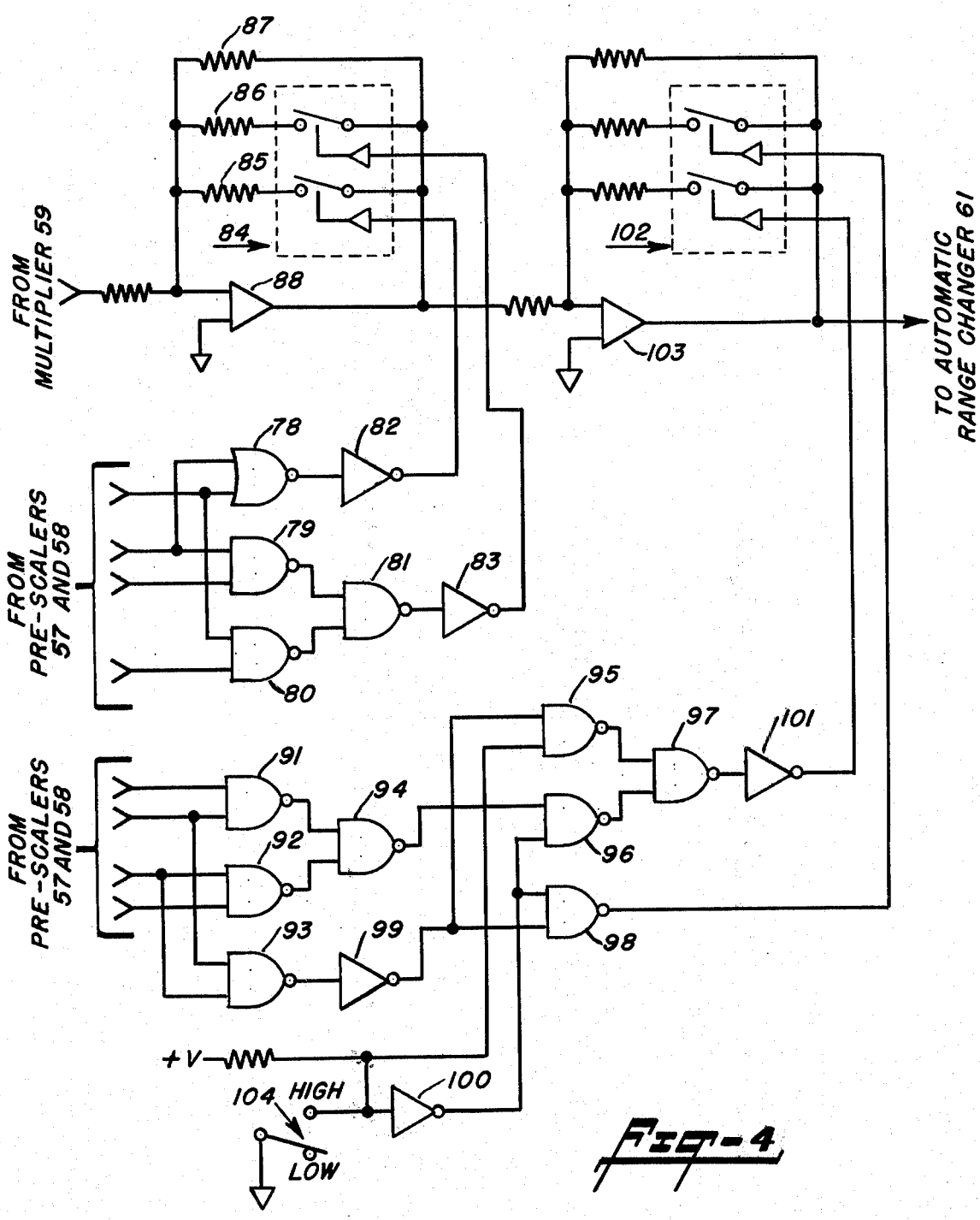

TEST SET FOR MEASURING IMPEDANCE AND POWER DISSIPATION OF A CRYSTAL

BACKGROUND OF THE INVENTION

With the advent of frequency dependent products such as electronic watches, color television, mobile communication equipment, etc., there has been a substantial increase in the use of crystals as frequency controlling elements. The important characteristics of a crystal are its impedance and its resonant and/or anti resonant frequency at a given power dissipation. Meters used to determine crystal frequency and impedance are generally referred to as crystal impedance meters. The resistance substitution technique is employed, that is, a crystal and a resistor alternately are connected into an oscillator circuit which is tuned to oscillate at the resonance frequency of the crystal. Present crystal impedance meters are not entirely satisfactory as the crystal impedance is measured at an arbitrarily set drive voltage and furthermore, calculations are required to determine the crystal power dissipation.

A crystal impedance meter made in accordance with this invention operates on the resistance substitution technique making it compatable with present measuring techniques. The crystal frequency and impedance are determined under conditions corresponding to the crystal power levels in actual use, with the power dissipation of the crystal measured directly.

SUMMARY OF THE INVENTION

A crystal under test is connected in an oscillator circuit and the frequency of the crystal drive voltage is adjusted to cause the crystal to oscillate. The crystal then is replaced by a variable resistor and the frequency of the drive voltage is adjusted to the crystal oscillation frequency. The value of the resistor is measured after it has been adjusted to produce a voltage drop equal to the voltage drop of the crystal. Voltages proportional to the voltage drop across the crystal and to the current flow through the crystal are applied to a measuring circuit which provides a direct measure of the power dissipation of the crystal.

An object of this invention is the provision of an improved meter for measuring the impedance and power dissipation of a crystal.

An object of this invention is the provision of a meter providing a direct measurement of crystal power dissipation thereby eliminating manual measurements and power level calculations.

An object of this invention is the provision of a crystal impedance meter in which the impedance of a crystal is measured under a relatively low drive voltage in line with todays crystal drive levels.

The above-stated and other objects and advantages of the invention will become apparent from the following description when taken with the accompanying drawings. It will be understood, however, that the drawings are for purposes of illustration and are not to be construed as defining the scope or limits of the invention, reference being had for the latter purpose to the claims appended hereto.

BRIEF DESCRIPTION OF THE DRAWINGS

In the drawings wherein like reference characters denote like parts in the several views:

FIG. 4 is a circuit diagram of the post-scaler shown in FIG. 2;

DESCRIPTION OF PREFERRED EMBODIMENTS

Figure 1:
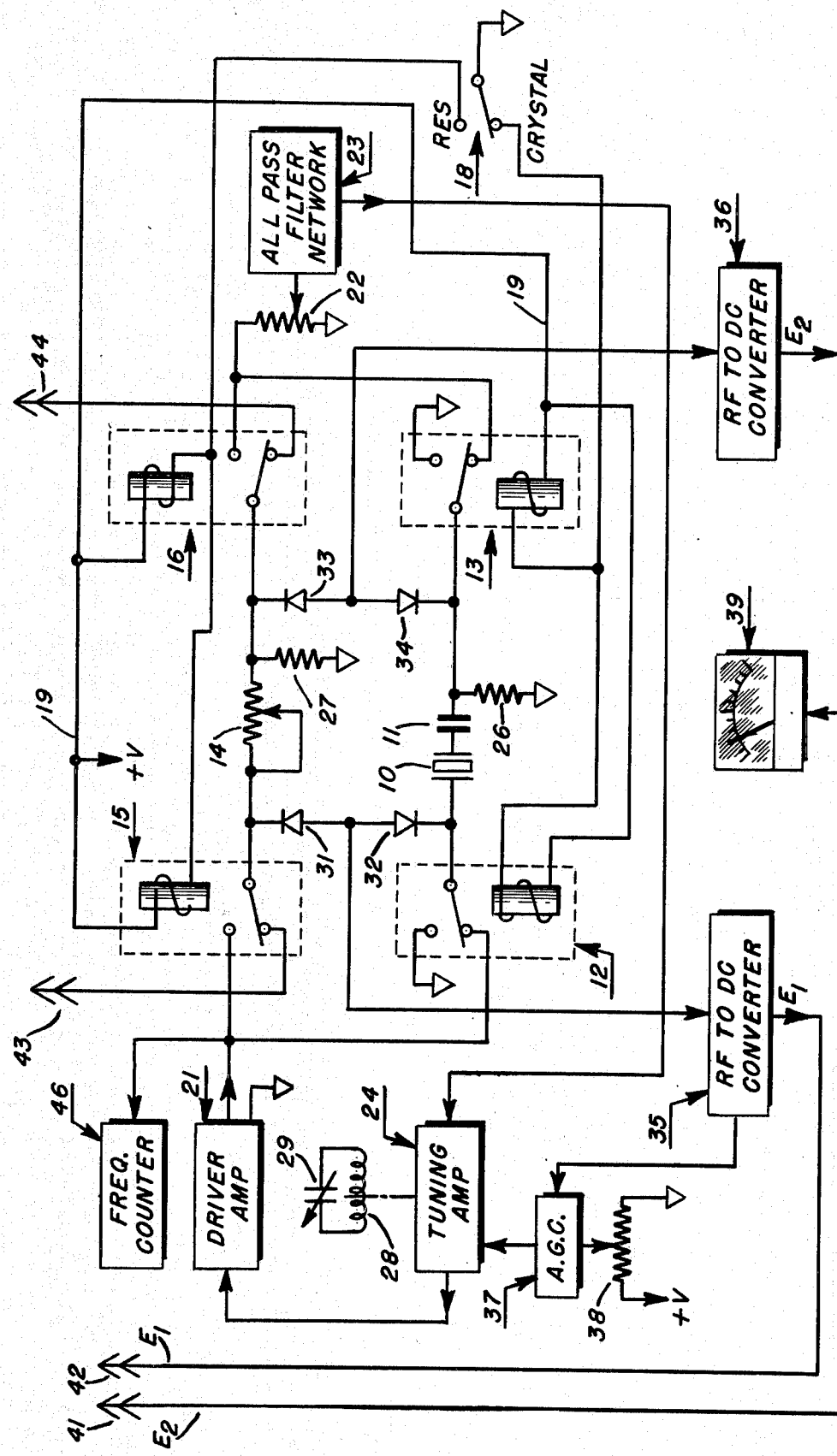
FIG. 1 is a circuit diagram of a high frequency oscillator circuit forming part of a crystal impedance meter made in accordance with one embodiment of this invention.

Referring to FIG. 1, a crystal 10, to be tested, and a load capacitor 11 are series connected to the movable contacts of a pair of single-pole, double-throw reed relays 12 and 13. An adjustable, substitution resistor 14 is connected to the movable contacts of a similar pair of reed relays 15 and 16. The operation of the reed relays is controlled by means of a manually-operable selector switch 18. Specifically, when this switch is in the illustrated position, the operating coils of the relays 12 and 13 are energized by the voltage appearing on the lead 19. Under this condition, the crystal is connected into a high frequency loop which includes a drive amplifier 21, a loop-gain potentiometer 22, an all pass filter network 23 and a tuning amplifier 24. When the selector switch 18 is set to the other position, the operating coils of the reed relays 12 and 13 are de-energized and the operating coils of the relays 15 and 16 are energized. Under this condition the substitution resistor 14 is connected into the loop in place of the crystal.

The driver amplifier 21 applies a drive voltage to either the crystal or the substitution resistor, depending upon the setting of the selector switch 18. The output of the crystal or the resistor 14 is taken across the resistors 26 and 27, respectively, and such output is fed to the filter network 23 through the loop-gain potentiometer 22. The resistors 26 and 27 are of equal value. This filter network is used for frequency compensation in the range of 16–60 megahertz. Due to the large phase shifts occuring through the drive amplifier and other circuitry, the tuning amplifier 24 cannot fully adjust for such phase shifts. Additional phase compensation is provided by the network 23. Actually, the phase shift around the entire RF loop cannot be brought to zero and, therefore, additional phase shifting is added to make the loop phase shift equivalent to 360°, which will cause the loop to oscillate.

The loop is tuned by means of a tuning amplifier 24 which includes one of several tuned transformer coils to provide a predetermined frequency band. For example, the coil 28 may cover a band of 4–8 megahertz whereas other coils may cover bands of 8–16, 16–32, and 32–60 megahertz. A variable capacitor 29 provides for fine tuning within a given frequency band. The outputs of the diodes 31 and 32 are fed to an RF to DC converter 35 providing a d.c. output voltage $E_1$, and the outputs of the diodes 33 and 34 are fed to an RF and DC converter 36 providing a d.c. output voltage $E_2$. Part of the output of the converter 35 is applied to an automatic gain control circuit 37 which is controlled by a power level potentiometer 38. This potentiometer sets the drive level to the crystal, which level is maintained constant by the automatic gain control. The voltage $E_2$ is proportional to the current flow through the crystal since such current is equal to $E_2$ divided by the value of the resistor 26. The voltage difference $E_1$ minus $E_2$ is equal to the voltage drop across the crystal. A voltmeter 39 is used to measure $E_2$ for purposes to be described hereinbelow. The circuit shown in FIG. 1 is connected to the circuit shown in FIG. 2 as by means of four plug type connectors identified by the reference numerals 41–44.

The procedure for measuring crystal impedance is as follows. With the crystal 10 connected into the RF loop as shown in FIG. 1, the loop is tuned by means of the tuning amplifier 24 to cause oscillation of the crystal, the oscillation frequency being indicated by a frequency counter 46. The selector switch 18 then is closed to the other position, thereby resulting in the connection of the adjustable resistor 14 into the loop in place of the crystal, and the frequency indicated by the frequency counter is noted. If such frequency differs from the crystal oscillation frequency, the tuning amplifier is adjusted accordingly. Specifically, the tuning amplifier is adjusted so that the oscillation frequency of the loop is substantially the same when either the crystal or the adjustable resistor is connected into the loop. Now, with the crystal connected in the loop, the magnitude of the voltage $E_2$ is noted, such magnitude being indicated on the scale of the voltmeter 39. Thereafter, the adjustable resistor is connected into the loop and such resistor is adjusted so that the magnitude of the voltage $E_2$ under this condition is the same as that noted when the crystal was connected in the loop. This adjusted value of the substitution resistor is equal to the crystal impedance since the loop drive voltage is held constant by the automatic gain control circuit 37. With the selector switch 18 closed in the position shown in FIG. 1, the ohmic value of the adjustable resistor 14 is measured by circuitry shown in FIG. 2 and connected to the plug type connectors 43 and 44. The measuring circuitry, FIG. 2, comprises a reference voltage source 46, switch 47, range-changing resistors 48–50, range-changing switch 51, amplifier 52 and an indicating meter 53. The meter 53 is provided with two scales, one calibrated in ohms and the other in milliwatts. With the switch 47 closed and the selector switch 54 set to the illustrated position, the meter indicates the ohmic value of the adjustable resistor. The meter has a non-linear scale to solve the equation, $$e_o = e_r (R_o)/(R_o + R_x)$$

where:
$e_o$ = output voltage of amplifier 52,
$e_r$ = voltage of reference source 46
$R_o$ = ohmic value of a selected one of the range changing resistors 48–50, and
$R_x$ = ohmic value of the adjustable resistor 14, FIG. 1.

The direct measurement of the power dissipation of the crystal will now be described. For this purpose the crystal is connected in the RF loop as shown in FIG. 1. The output voltages $E_1$ and $E_2$ of the converters 35 and 36, respectively, are summed in a differential amplifier 56, FIG. 2, to produce a difference voltage $(E_1-E_2)$, which is the voltage across the crystal. The voltage $(E_1-E_2)$ is applied to a pre-scaler 57 and the voltage $E_2$ is applied to a pre-scaler 58, said voltage $E_2$ being equal to the current $I_c$ flowing through the crystal multiplied by the ohmic value $R_s$ of the sensing resistor 26, (FIG. 1). The circuitry of the pre-scalers will be described below with reference to FIG. 3. The voltages $(E_1-E_2)$ and $E_2$ are pre-scaled by the factors $K_i$ and $K_j$, respectively. Pre-scaling is used to automatically increase the level of the input signals before they are fed to a transconductance multiplier 59 in order to keep the output of the multiplier at workable levels with small values of $(E_1-E_2)$ and $E_2$. Inherent in a transconductance multiplier is an automatic division by 10. Therefore, when the signals are low at the multiplier input, especially when the signals are less than 1 volt, the output of the multiplier is extremely low and is greatly affected by offset variations. To get away from this condition, the input signals are scaled up, keeping the output of the multiplier at a higher level.

The output of the multiplier 59 is equal to the product of $(E_1-E_2)$ and $E_2$ and since $(E_1-E_2)$ is the voltage across the crystal while $E_2$ is proportional to the current through the crystal $(E_2 = I_c R_s)$, the multiplier output is, therefore, proportional to crystal power. The output of the multiplier is applied to a post-scaler 60 which will be described in detail hereinbelow with reference to FIG. 4. The post-scaler compensates for the pre-scaling gain ($K_i K_j$), the automatic division of the multiplier by 10, and the resistance of the sensing resistor 26 (FIG. 1), leaving the post-scaler output equal to $(E_1-E_2) I_c$, which is the crystal power dissipation, P. The automatic range changer 61 changes the level of the signal applied to the meter 53 in order to increase the scale sensitivity at low power levels.

Figure 2:
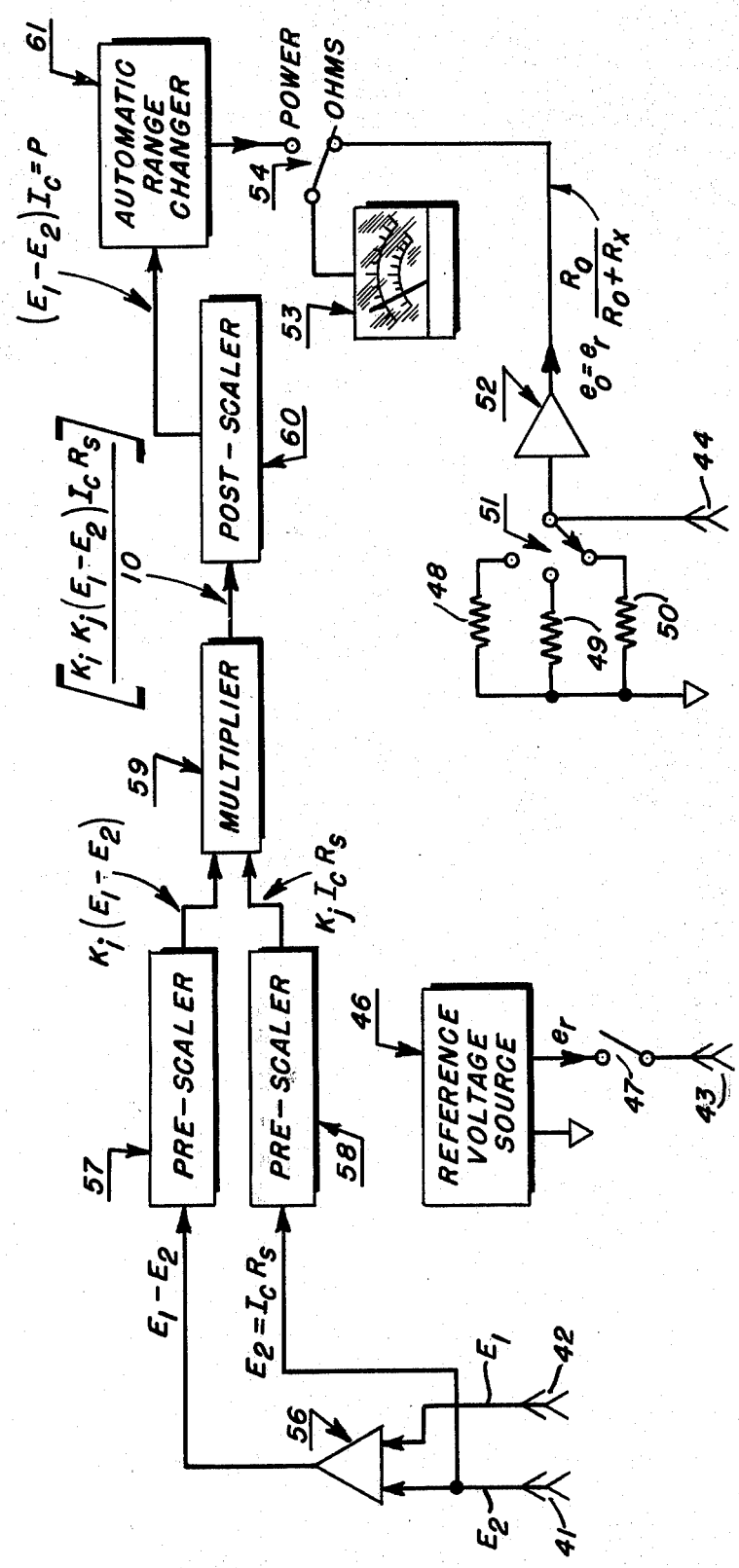
FIG. 2 is a block diagram of the circuit for direct measurement of crystal power dissipation.
Figure 3:
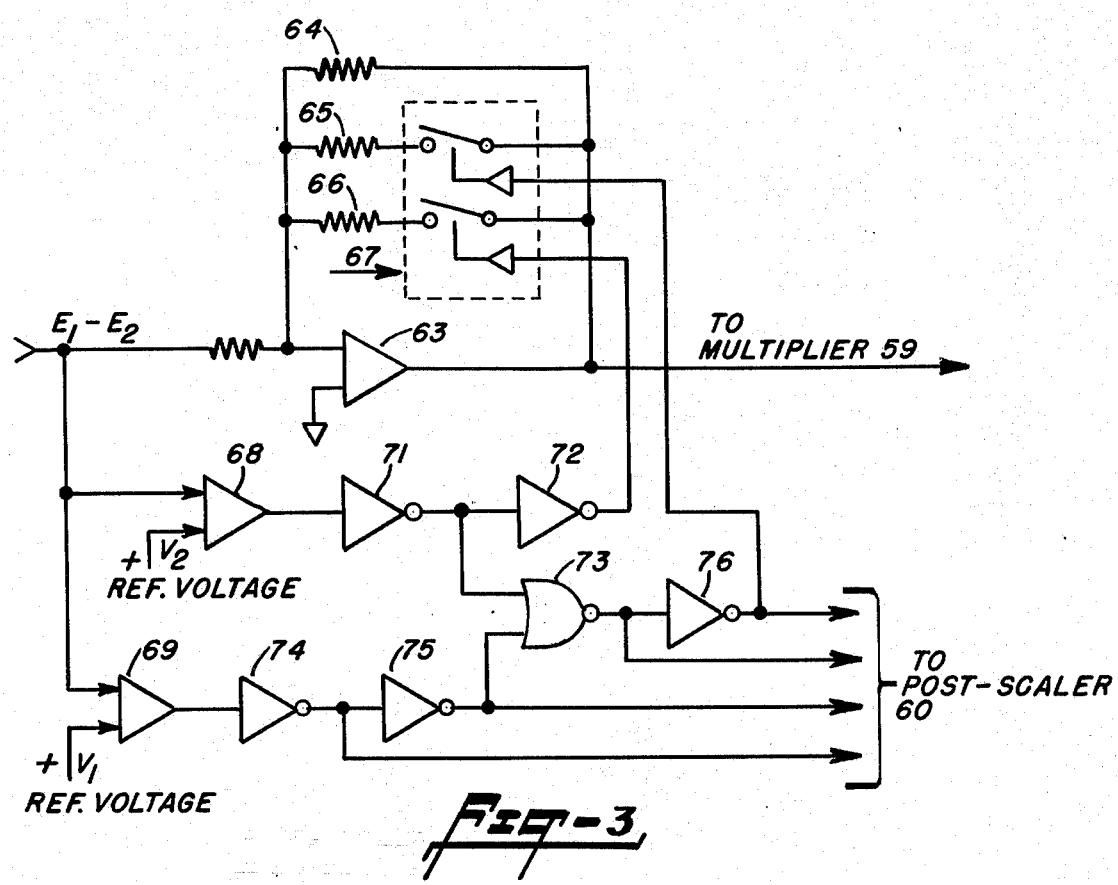
FIG. 3 is a circuit diagram of one of the pre-scalers shown in FIG. 2.

Reference now is made to FIG. 3 showing the circuitry of the pre-scaler 57 (FIG. 2). The voltage $(E_1-E_2)$ is applied to an operational amplifier 63 having feedback resistors 64–66, the resistors 65 and 66 being connectable into the feedback circuit by a analog switch 67. The output of this amplifier is applied to the multiplier 59 (FIG. 2). The voltage $(E_1-E_2)$ also is applied as one input to the comparators 68 and 69, the other inputs to these comparators being reference voltages $+V_2$ and $+V_1$, respectively. The output voltage of the comparator 68 is fed to an inverter 71 whose output is applied to a second inverter 72 and NOR gate 73. A second voltage also is applied to this gate from the comparator 69 and the inverters 74 and 75. The output of the gate 73 and the inverters 74, 75 and 76 are applied to the post-scaler 60 (FIG. 2). The output voltages from the inverters 72 and 76 control the operation of the analog switch 67. The gain ($K_i$) of the amplifier 63 depends upon the level of the incoming signal ($E_1-E_2$). Three values of gain are available based upon ($E_1-E_2$) being either less than the reference voltage $V_1$; or between the reference voltages $V_1$ and $V_2$; or greater than the reference voltage $V_2$. The comparator 69 senses when the input signal ($E_1-E_2$) is more or less than $V_1$ and the comparator 68 senses when such signal is more or less than $V_2$. The components identified by the reference numerals 71–76 comprise a logic circuit which provides proper operation of the analog switch 67 to set the gain ($K_i$) of the amplifier in correspondence with the level of the signal ($E_1-E_2$) relative to the two reference voltages.

The circuitry of the pre-scaler 58 is the same as that of the described pre-scaler 57. However, the pre-scaler 58 responds to the level of its input signal $E_2$ to set the gain ($K_j$) of its amplifier to one of three values in correspondence with the level of $E_2$ relative to the two reference voltages.

Reference now is made to FIG. 4 showing the circuitry of the post-scaler 60 (FIG. 2). One section of the post-scaler comprises an NOR gate 78, NAND gates 79–81 and inverters 82 and 83. This section receives four signals, two from each of the pre-scalers 57 and 58, and provides two output signals to an analog switch 84 which controls the connection of the feedback resistors 85 and 86 across the amplifier 88, thereby controlling amplifier gain. A second section of the post-scaler comprises eight NAND gates 91–98 and the inverters 99–101. This section also receives four signals, two from each of the pre-scalers 57 and 58, and provides two output signals to the analog switch 102 controlling the gain of the amplifier 103. Also, a manually-operable switch 104 is provided for increasing the amplifier gain, thereby to provide higher readings on the watt scale of the meter 53, FIG. 2. The post-scaler compensates for the gain changes occuring in the two pre-scalers, which gain changes correspond to the three levels of the voltages ($E_1-E_2$) and $E_2$ relative to the two reference voltages applied to each of the pre-scalers. The output from the multiplier 59, (FIG. 2), is amplified by the amplifiers 88 and 103 of the post-scaler and fed to the automatic range changer 61.

Figure 5:
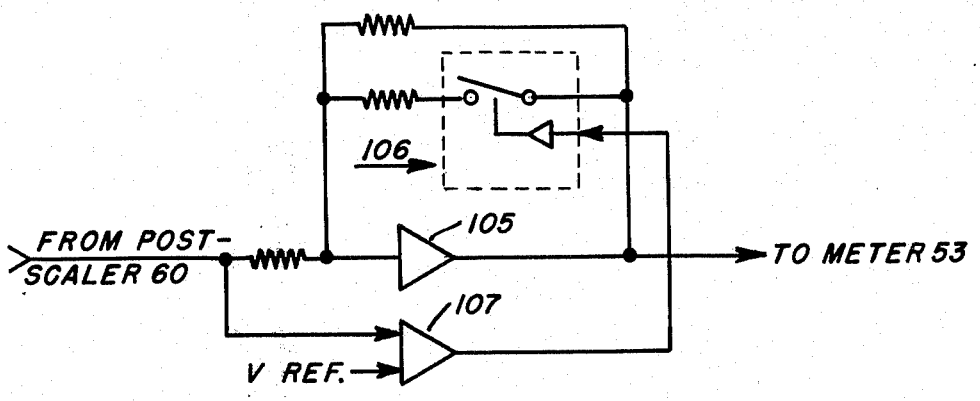
FIG. 5 is a circuit diagram of the automatic range changer shown in FIG. 2.

The circuit of the automatic range changer 61, shown in FIG. 5, comprises an operational amplifier 105 the gain of which is controlled by an analog switch 106, the operation of said switch being controlled by a comparator 107 receiving the output voltage of the post-scaler and a reference voltage. This reference voltage has a magnitude equal to that required to produce 25% of full scale indication of the meter 53 (FIG. 2). This results in the expansion of the meter scale when the voltage from the post-scaler falls below the level of the reference voltage.

Figure 6:
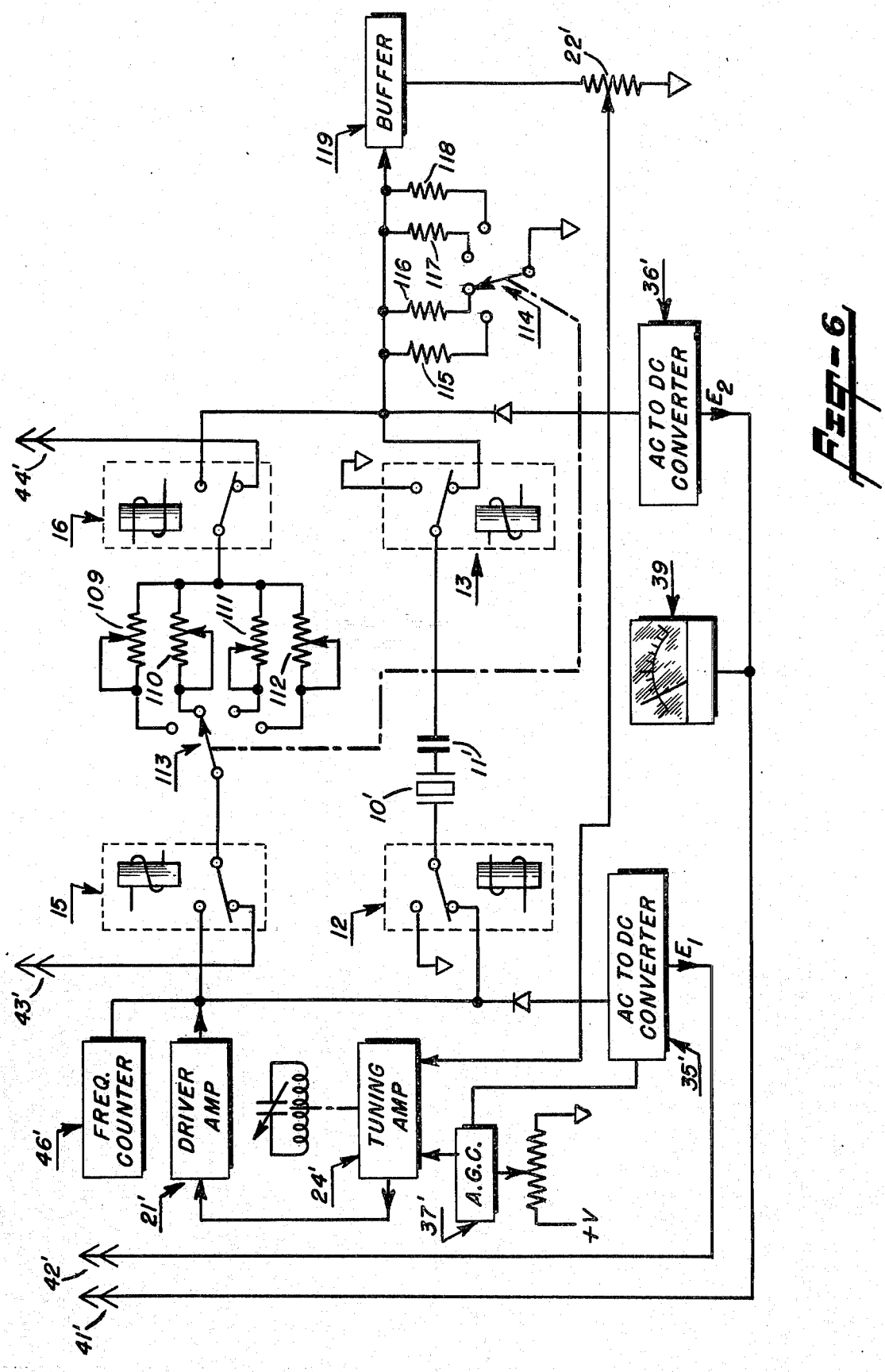
FIG. 6 is a circuit diagram of a low frequency oscillator circuit forming part of a crystal impedance meter made in accordance with another embodiment of this invention.

Reference now is made to FIG. 6 showing a circuit for use in testing low frequency crystals. The crystal 10' and load capacitor 11' are connected to the movable contacts of the reed relays 12 and 13. A selected one of the adjustable resistors 109–112 is connectable to the movable contacts of the reed relays 15 and 16 by means of the switch 113. The selection of a particular resistor depends upon the impedance range of the crystal under test. A second switch 114 operates simultaneously with the switch 113, said switch 114 serving to connect an appropriate one of the sensing resistors 115–118 to a buffer 119. Although not shown in FIG. 6, the energization and de-energization of the reed relays depends upon the setting of a manually-operable switch, such as the switch 18 shown in FIG. 1. The buffer 119 is used for impedance matching of the sensing resistors 115–118 to the loop gain control 22'. The driver amplifier 21', tuning amplifier 24', the converters 35', 36', and the automatic gain control 37' are constructed and arranged to provide the lower frequencies for the testing of the lower frequency crystals. The circuit of FIG. 6 is connectable to the circuit of FIG. 2 by means of the four plug type connectors 41', 42', 43', and 44', which connectors correspond to the similarly numbered connectors of FIG. 2. Whereas the circuit of FIG. 1 covers crystal frequency ranges 4–60 magahertz, the circuit of FIG. 6 covers a frequency range of 2.5 kilohertz to 4.0 megahertz. However the same procedures are used to measure crystal impedance and power dissipation at the crystal resonance frequency.

Having now described the invention what I desire to protect by letters patent is set forth in the following claims.

I claim:

1. In a crystal test set of the type comprising an oscillator circuit which includes a crystal under test, an all pass filter network, and an a.c. driver amplifier connected to form a closed loop; means for adjusting the frequency of the oscillator circuit to cause the crystal to resonate; an adjustable substitution resistor; and means for inserting the resistor in the oscillator circuit in place of the crystal; the improvement comprising,
   a. means automatically maintaining the driver amplifier output voltage at a predetermined constant level,
   b. means developing a d.c. voltage $E_1$ equal to the output voltage of the driver amplifier which is applied to the crystal,
   c. means developing a d.c. voltage $E_2$ equal to the output voltage of the crystal,
   d. a differential amplifier receiving the voltages $E_1$ and $E_2$ and producing a difference voltage ($E_1-E_2$) which is the voltage across the crystal,
   e. a voltage multiplier circuit,
   f. circuit elements applying the voltages ($E_1-E_2$) and $E_2$ to said multiplier circuit, said circuit producing an output voltage ($E_2-E_2$) ($E_2$) which voltage is proportional to power dissipated in the crystal,
   g. read out means having a scale calibrated in milliwatts and in ohms,
   h. a d.c. voltage reference source,
   i. means for connecting said read out means to the output of said multiplier circuit, and
   j. means for connecting said read out means and said substitution resistor in series across the said voltage reference source.

2. The improvement recited in Claim 1, wherein said multiplier circuit includes means increasing the voltage ($E_1-E_2$) by a factor $K_i$, means increasing the voltage $E_2$ by a factor $K_j$, and means decreasing the output of said multiplier circuit by a factor proportional to $(1)/K_i K_j$; where each of the factors $K_i$ and $K_j$ is 1.0 or larger.

* * * * *